United States Patent
Plais et al.

(10) Patent No.: US 6,627,489 B1
(45) Date of Patent: Sep. 30, 2003

(54) METHOD OF PRODUCING CMOS TRANSISTORS AND RELATED DEVICES

(75) Inventors: François Plais, Paris (FR); Carlo Reita, Les Ulis (FR); Odile Huet, Massy (FR)

(73) Assignee: Thomson-CSF, Paris (FR)

( * ) Notice: Subject to any disclaimer, the term of this patent is extended or adjusted under 35 U.S.C. 154(b) by 0 days.

(21) Appl. No.: 09/601,350
(22) PCT Filed: Dec. 15, 1999
(86) PCT No.: PCT/FR99/03151
  § 371 (c)(1),
  (2), (4) Date: Aug. 18, 2000
(87) PCT Pub. No.: WO00/38229
  PCT Pub. Date: Jun. 29, 2000

(30) Foreign Application Priority Data

Dec. 18, 1998 (FR) .............................. 98 16028

(51) Int. Cl.$^7$ .......................................... H01L 21/8238
(52) U.S. Cl. ....................... 438/199; 438/151; 438/152; 438/166; 438/308; 438/230; 438/231; 438/299
(58) Field of Search ................................ 438/524, 151, 438/152, 166, 308, 230, 199, 231, 299

(56) References Cited

U.S. PATENT DOCUMENTS

| 5,741,735 A | * | 4/1998 | Violette et al. ............. 438/199 |
| 5,767,930 A | * | 6/1998 | Kobayashi et al. ........... 349/42 |
| 6,429,485 B1 | * | 8/2002 | Ha et al. .................... 257/351 |

* cited by examiner

*Primary Examiner*—Caridad Everhart
*Assistant Examiner*—V. Yevsikov
(74) *Attorney, Agent, or Firm*—Oblon, Spivak, McClelland, Maier & Neustadt, P.C.

(57) ABSTRACT

A method for making CMOQ transistors and associated devices. The method is used to make transistors of a first type and a second type in CMOS technology in an active layer. The method etches regions of the active layer or making them inactive so as to define active islands designed to form sources, channels of determined width, and drains of the transistors of the first type and second type respectively, covers at least two active islands with an insulating layer and covers the insulating layer with a conductive layer, and sequentially etches all the gates of the transistors of the first type and then all the gates of the transistors of the second type. The associated devices includes CMOS transistor devices obtained by the method. Such a method may particularly find application to devices for the addressing and control of active matrix liquid crystal displays.

13 Claims, 4 Drawing Sheets

METHOD OF PRODUCING CMOS TRANSISTORS AND RELATED DEVICES

BACKGROUND OF THE INVENTION

1. Field of the Invention

The invention relates to the making of MOS transistors, a device comprising MOS transistors obtained by a method such as this and a device for the addressing and control of an active matrix made with devices such as these.

The invention pertains especially to an addressing and control device for an active matrix liquid crystal display.

The invention relates especially to the field of large-scale consumer electronics. It can be used to make electronic circuits with CMOS complementary transistors made of polycrystalline silicon. These transistors may comprise a lightly doped gate-edge region.

The invention can be applied to low-temperature methods (Tmax<450° C.) compatible with non-refractory and non-crystalline substrates 2. Discussion of the Background AMLCDs or Active Matrix Liquid Crystal Displays are made, according to prior art techniques, on a glass plate. The addressing of the active matrix liquid crystal displays is presently done by the integration of thin-film transistors on the glass plate. These TFT transistors are made out of amorphous hydrogenated silicon aSi:H. TFT transistors of this type have low electron mobility, in the range of 0,5 cm$^2$ V$^{-1}$ s$^{-1}$. The technology implemented to make them cannot be used to obtain a complementary logic circuitry. These constraints limit the use of such a technology to the making of the transistors needed to address the pixels of the screen. The management of the screen includes the selection of the lines, shaping and the presentation of the video. data on the different columns. The making of a device to carry out screen management requires the use of another technology, for example a technique to transfer silicon integrated circuits to the periphery of the glass slab.

To overcome the drawbacks of the technologies using amorphous silicon, the technologies are developing towards the use of thin-film polycrystalline silicon. The value attached to the use of thin-film polycrystalline silicon lies in the possibilities offered by this material for making high-quality electronic circuits on non-refractory and non-crystalline substrates.

The chief known applications lie in the addressing of active matrix liquid crystal displays.

Polycrystalline silicon enables the low-temperature manufacture of N type and P type TFTs with high values of mobility in the range of 100 and 50 cm$^2$ V$^{-1}$ s$^{-1}$ respectively. Polycrystalline silicon can therefore be used to make CMOS circuits with performance characteristics compatibles with the addressing of flat screens. The integration of all or part of the peripheral addressing electronics results in a relative decrease in the cost of the screen related to the disappearance of the integrated circuits. However, this is true only inasmuch as the increase in the complexity of the circuits made on the glass plate do not result in any major drop in manufacturing efficiency levels. The manufacturing efficiency is directly related to the number of masks used for the making of the electronic circuits.

The basic known method for the making of CMOS circuits on insulator substrates (for example of the SOI or Silicon On Insulator type) calls for at least six masks corresponding to the following steps:

definition of the silicon islands,
definition of the gate of the transistors,
definition of the N type implantation region,
definition of the P type implantation region,
opening of the contact holes,
definition of the metal.

SUMMARY OF THE INVENTION

The aim of the invention is to reduce the number of masks needed to make CMOS technology circuits as compared with known methods.

To this end, an object of the invention is a method for making transistors of a first type and a second type by CMOS technology in an active layer, characterized in that it consists in:

etching regions of the active layer or making them inactive so as to define active islands designed to form the sources, the channels of determined width and the drains of transistors of the first type and second type respectively, covering at least the active islands with an insulating layer and then a conductive layer, sequentially etching all the gates of the transistors of the first type and then all the gates of the transistors of the second type.

The gate of each transistor controls the transistor by enabling the control of the channel of this transistor.

The advantage of the method according to the invention is that it reduces the number of masks and the number of implantation steps.

In the basic known method, the gates of the NMOS and PMOS transistors are etched simultaneously. The N+ and P+ contact regions are obtained by ion implantation. They are self-aligned with respect to the gate edges: the gate plays the role of a mask. For the N type transistors, this situation leads to intense electrical fields in the gate edge channel. The intense electric fields induce either instability in the characteristics when the gate bias is positive or major leakage currents when the gate bias is negative. The instability of the characteristics is related to the generation of hot electrons in the channel and the creation of interface defects when these hot carriers interact with the hydrogen atoms, making the defects of the SiO$_2$/Si interface passive. The leakage currents originate in the intense electrical field of the reverse-biased drain-channel junction. The level of the leakage currents then depends exponentially on the drain-source and gate-source voltages.

To attenuate these intense electrical fields, a particular region is made at the gate edge. This region has the characteristic of being more lightly doped than the rest of the channel. It is called an LDD region or lightly doped drain region. The LDD region is an N− type region for an N type transistor N. The extension of the LDD region is in the range of 10% of the length of the channel, i.e. about 0,1 μm for monocrystalline silicon technologies and about 0,5 for polycrystalline silicon technologies. In monocrystalline technology, the LDD region is obtained by making a gate edge spacer or dielectric space. The spacer is obtained by appropriate deposition and anisotropic etching of a dielectric film. This technology is not directly applicable to large-surface substrates.

In known polycrystalline silicon technologies, the making of the LDD region requires a special mask and a particular step of implantation. This takes the number of masks needed to seven and the number of implantation steps to three. The invention reduces the number of masks needed to five and the number of implantation steps to two. The invention provides for a self-alignment of the LDD region and permits a check on the dose of dopant independently of the extension of the LDD region.

In the known polycrystalline silicon technologies, the LDD region is obtained by a light dose implantation self-aligned on the gate. After this, the LDD region is protected by resin during the heavy-dose implantation with dopant, namely N+ type implantation for an N type transistor, for example phosphorus. This may give rise to additional technological difficulties related to the heating of the resin under the flow of ions when the method is carried out on large-sized glass plates. This risk is totally absent in a method according to the invention. The layer of protective resin is removed before the heavy-dose implantation of a dopant.

An object of the invention is also a device for the addressing and control of an active matrix liquid crystal display made with CMOS transistors obtained by a method according to the invention.

The addressing and control device comprises an addressing device and a control device. The addressing device is a device with CMOS complementary transistors.

The control device is a device that does not require complementary transistors. It is preferably made with N type transistors. When these transistors are provided with an LDD region, according to a particular embodiment of the invention, they have the advantage of having a very limited leakage current. This characteristic is particularly important for large-sized active matrix screens. Each pixel of the screen is controlled by means of the gate of a transistor. Between two operations for refreshing a row of the matrix, the state of a pixel is held by means of the memory function obtained by the association of the capacitance of the pixel and the off state of the transistor, provided however, that the drain-source leakage current does not have the time to have any notable effect on the charge of the capacitance. Thus, the drain-source leakage current of the control transistors has an immediate effect on the quality of the image. In particular, the greater the drain-source leakage current, the more it results in a large

BRIEF DESCRIPTION OF THE DRAWINGS

The invention will be understood more clearly and its other characteristics and advantages will appear from the following description given by way of a non-restrictive illustration made with reference to the appended figures of which.

DESCRIPTION OF THE PREFERRED EMBODIMENTS

Figure 1:
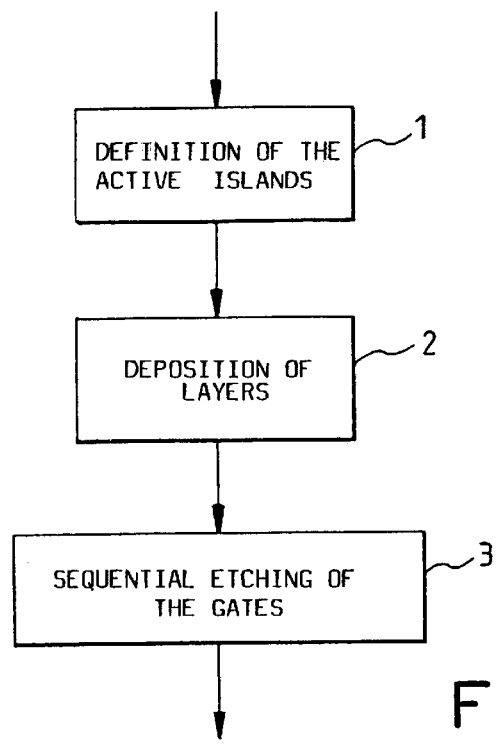
FIG. 1 shows the steps of the method according to the invention

FIG. 1 illustrates the different steps in the carrying out of the method according to the invention. The method can be applied to a substrate on which an active thin layer is made. To make transistors of a first and second type, using CMOS technology in the active layer, the method takes place in several steps. In a first step, the method consists in defining 1 active islands. The definition 1 of the active islands is done either by the etching of the regions of the active layer or by making regions of the active layer inactive. The active islands are designed to form the sources, channels and drains of the transistors of the first type and second type respectively. In a second step, the method consists of the deposition 2 of two layers. A first layer covers at least the active islands. A second conductive layer covers the first layer. The second conductive layer is designed to form the control gate of the transistors. In a third step, the method consists of the sequential etching 3 of all the gates of the transistors of the first type and all the gates of the transistors of the second type. The etching of all the gates of the transistors of a given type is done by means of a particular mask. The mask reproduces the gates of the transistors of the given type and masks the implantation regions of the transistors of the other type. With the same mask, it is thus possible to perform doping operations for a given type of transistor.

Figure 2A:
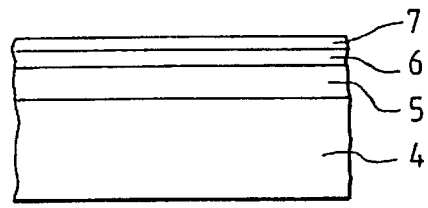
FIGS. 2a, 2b, 2c show steps in the definition of active islands and the deposition of layers for a first or second type of transistor.
Figure 2B:
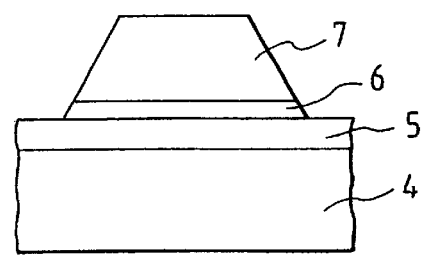
Figure 2C:
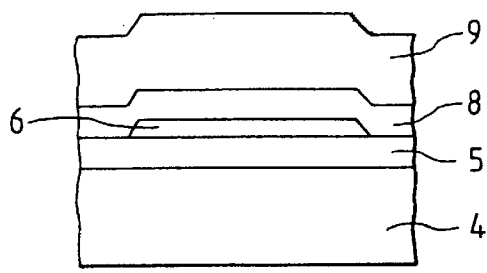

FIGS. 2a, 2b and 2c illustrate the steps for the definition 1 of active islands and deposition 2 of the first and second layers for a first or second type of transistor. Hereinafter in the description of the method, the first type corresponds to the N type and the second type to the P type. This choice corresponds to a first mode of implementation of the method. The N type transistors and the P type transistors are made by the first mode of implementing the method according to the invention, on a same substrate. The substrate 4 preferably consists of glass on which there is deposited a preparation layer 5 designed to obtain a surface condition favorable to subsequent treatment. According to the prior art, this preparation layer may be made of silica $SiO_2$. An active layer 6 is deposited on the preparation layer 5. The active layer 6 consists for example of polycrystalline silicon. A layer of protection resin 7 is deposited on the active layer 6.

A first mask, not shown, reproduces the active islands to be preserved in the active layer 6. These are active islands with which it is possible, subsequently, to make the sources, channels and drains of the transistors. The active islands are made by known techniques, for example by etching.

According to the illustration in FIG. 2b, the active islands 6 are made by removing material. In one variant of this technique, the regions not masked by the first mask are made inactive, for example by passivation, rather than being eliminated. Once the active islands 6 have been made, the resin layer 7 is eliminated by known techniques, for example aqueous baths.

In a following step, the insulator layer 8 and the conductive layer 9 are deposited in succession. The insulator layer 8 is, for example, a silicon oxide, especially $SiO_2$. The insulator layer 8 has a thickness of 50 to 150 nm. According to the illustration in FIG. 2c, the insulator layer 8 covers the totality of the substrate. In alternative modes of implementation of the method, the insulator layer 8 covers at least the active islands 6. The conductive layer 9 is made, for example, with N+ doped polycrystalline silicon or with a metal, for example tungsten (W), molybdenum (Mo) or aluminium (Al). Between the different metals, the choice will preferably be that of aluminium which is the least resistive metal. The conductive layer 9 has a thickness ranging from 150 to 300 nm. It is designed to form the gate of the transistors.

FIGS. 3a, 3b, 3c, 3d, 3e, 4a, 4b, 4c, 4d and 4e, illustrate the step of sequential etching of all the gates of the N type transistors and of all the gates of the P type transistors.

In a first mode of implementation of the method according to the invention, the N type transistors and the P type transistors are made on one and the same substrate. The first mode of implementation of the method is illustrated in FIGS. 3a to 3e and 4a to 4e which represent the different regions of one and the same substrate. FIGS. 3a to 3e illustrate a region of implantation an N type transistor while FIGS. 4a to 4e illustrate a region of implantation of a P type transistor.

Figure 3A:
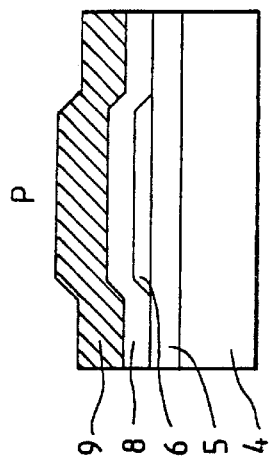
FIGS. 3a, 3b, 3c, 3d and 3e show steps in the etching of the gates for a transistor of the first type.
Figure 4A:
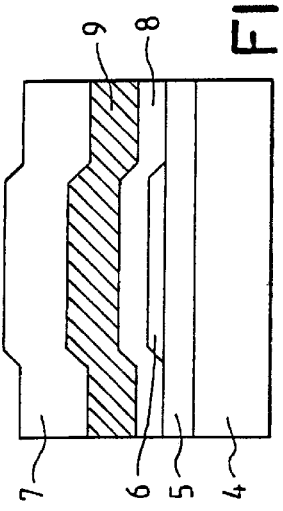
FIGS. 4a, 4b, 4c, 4d and 4e show steps in the etching of the gates for a transistor of the second type, FIGS. 5a and 5b respectively show a schematic top view of a gate of a first type and a gate of a second type respectively.

FIGS. 3a and 4a respectively show a substrate 4 covered with a preparation layer 5 on which an active island 6 is etched. The active island 6 is buried beneath an insulating layer 8, which is itself covered with a conductive layer 9. FIGS. 3a and 4a respectively take up the method as illustrated in FIG. 2c.

Figure 3B:
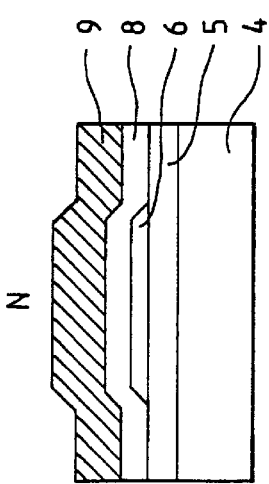
Figure 4B:
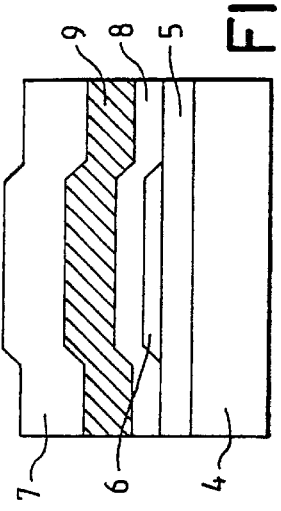
Figure 3C:
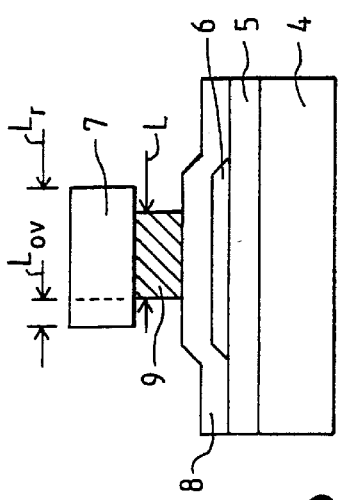
Figure 4C:
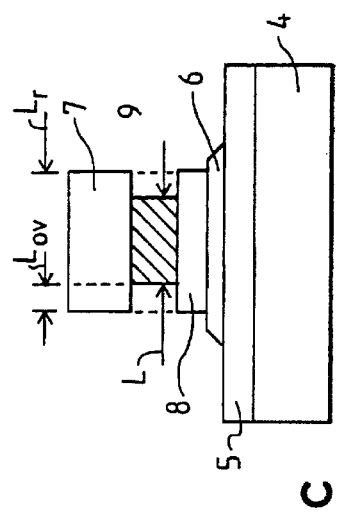

Between FIGS. 3a, 3b, and 4a, 4b respectively, a protective resin layer 7 has been deposited to protect certain regions. A second mask, not shown, defining the gates of the N type transistors is used to etch solely the gates 9 of the N type transistors, FIG. 3b. During the etching of the gates of the N type transistors, the protective resin layer 7 remains intact on the P type transistors. FIG. 4b gives an illustration of it. The etching of the gates of the N type transistors consists of an etching done isotropically as illustrated in FIG. 3b. It is followed by an etching done anisotropically as illustrated in FIGS. 3c and 4c. The technique of isotropic etching implemented may be either a wet etching technique or a dry etching technique. If the conductive layer 9 is made out of molybdenum Mo or aluminium Al, the wet etching technique is generally used (in this technique, the circuit to be etched is steeped in a solution). If the conductive layer 9 is made out of polycrystalline silicon or tungsten W, the dry etching technique is generally chosen. It consists of the introduction of the circuit to be etched into a plasma-filled chamber. Isotropic etching opens out an over-etched depth $L_{ov}$. The over-etching depth $L_{ov}$ is controlled so as to be between 0.2 and 2 $\mu$m in the case of a dry etching technique and between 0.5 and 2 $\mu$m in the case of a wet etching technique. The isotropic etching of the conductive layer 9 is done until the insulator layer 8 is reached.

The second mask is maintained during the anisotropic etching. The anisotropic etching is done solely by a dry etching method. This operation consists in etching the insulator layer 8 in a way that is self-aligned with the resin 7 until the active island 6 is reached. The succession of the two etchings, namely the isotropic etching and the anisotropic etching, gives a step at the gate edge, constituted by the insulator layer 8.

The width of the step is equal to the over-etching depth $L_{ov}$. Let $L_r$ be the length of the protective resin layer 7 etched during the operation of etching the gate illustrated by FIG. 3b. The length L of the gate, etched in the conductive layer 9, is given by the relationship:

$$L = L_r - (2 \cdot L_{ov}) \qquad (1)$$

Since the second mask reproduces only the gates of the N type transistors, the protective resin layer 7 maintains a protection, as shown in FIGS. 4b and 4c, over the P type transistors. After the anisotropic etching operation, the protective layer of resin 7 is removed.

After the etching of the gates of the N type transistors and the etching of the insulator steps, the method consists of the doping of the sources and drains of the N type transistors. For the N type transistors, the dopant used is N type doping, for example phosphorus. The doping operation is done on the surface without any mask or protective resin. The implantation regions of the P type transistors are automatically protected during the operation of doping the N type transistors: the metal layer 9 totally covers the implantation regions of the P type transistors and protects them from the dopant.

Figure 4D:
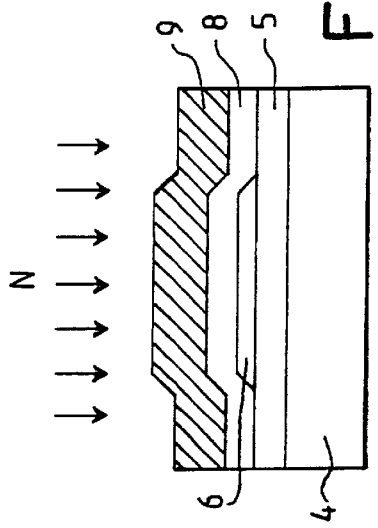
Figure 3D:
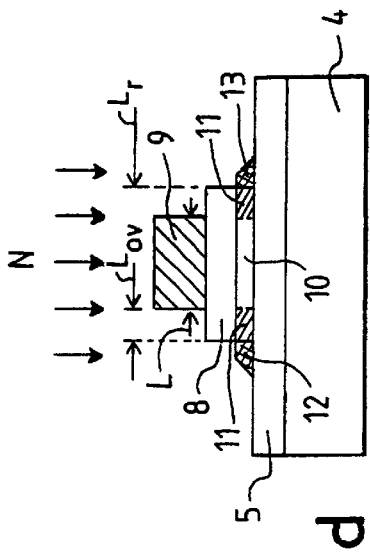
Figure 3E:
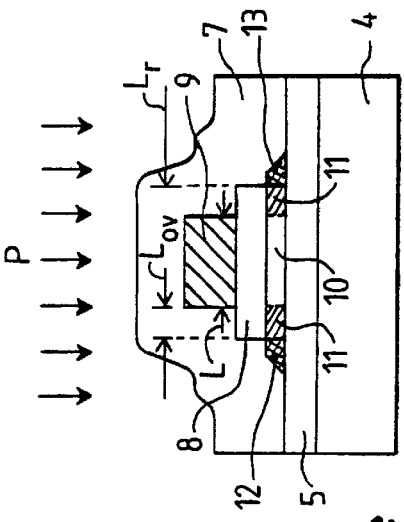

In the first mode of implementation of the method, the method comprises a particular operation. This operation consists of the implantation of a lightly doped region, called an LDD, at the edge of the gate of the N type transistors. It is illustrated by FIGS. 3d and 4d. According to this operation, the operation of doping with an N type dopant consists of the sequential implantation of the following:

a heavy dose of the dopant at low energy, i.e. for example a dose of phosphorus with a density $D=10^{15}$ cm$^2$ in a field with an energy value E=15 kev, a light dose of the dopant at high energy, i.e. for example a dose of phosphorus with a density $D=10^{13}$ cm$^2$ in a field with an energy level E=100 kev.

The implantation of a heavy dose at low energy causes the dopant to penetrate up to a depth of about 40 nm. Since this depth is smaller than the thickness of the insulator layer 8, the part of the channel 10 located beneath the insulator layer is protected by this layer during this implantation.

The implantation of a light dose at high energy has an implantation peak at about 150 nm from the surface. It leads to a penetration of the dopant, beyond the insulator layer 8, in a region 11 of the channel 10 not protected by the gate 9. The active 35 islands 6 of the P type transistors are totally protected by the superimposition of the insulator layer 8 and of the conductive layer 9, as illustrated by FIG. 4d.

The source 12 and the drain 13 of a transistor are on either side of the gate 9 in the prolongation of the channel 10. During each of the previous two implantations, the dopant penetrates the regions of the active island that are not masked by the gate 9 enabling the source 12 and the drain 13 to be doped.

With the protective resin layer 7 having been eliminated before the doping operation, the method is advantageously used to carry out the implantation of a heavy dose of phosphorus without having any residual resin on the substrate 4. It is indeed known that an implantation with a heavy dose of phosphorus (atomic mass 29) is capable of causing the glass plate to get heated to a temperature of over 120–150° C. The heating jeopardizes the operation of eliminating the layer of protective resin, while leaving organic residues on the surface.

The method then consists of the operation of etching the gates of the P type transistors and the operating of doping with a P type dopant. In accordance with the illustration in FIGS. 3e and 4e, the method consists of the deposition of a protective layer of resin 7 on all the transistors, both the N type transistors and the P type transistors. A third mask (not shown) reproducing the gates of the P type transistors and masking all the N type transistors is used to etch the gates 9 of the P type transistors.

The etching operation is of the anisotropic type. It can be used to self-align the etching of the conductive layer 9 and of the insulator layer 8 on the protection resin 7.

The doping operation makes it possible to dope the sources 12 and the drains 13 of the P type transistors. The doping is P type doping. For example, it may be boron. The doping operation consists in implanting a high doses of dopant with very low energy, for example, a density $D=10^{15}$ cm$^2$ of dopant with an energy E=5 kev. During the doping operation, the N type transistors are protected by the protection resin layer 7. The heating problem encountered with phosphorus is almost non-existent in the case of boron, firstly because of the difference in atomic mass between boron (atomic mass 10) and phosphorus (atomic mass 29) and secondly because of the energy brought into play which is lower during the implantation of boron.

Figure 4E:
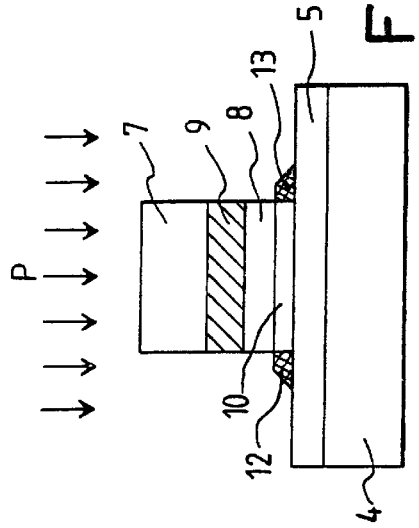
Figure 5A:
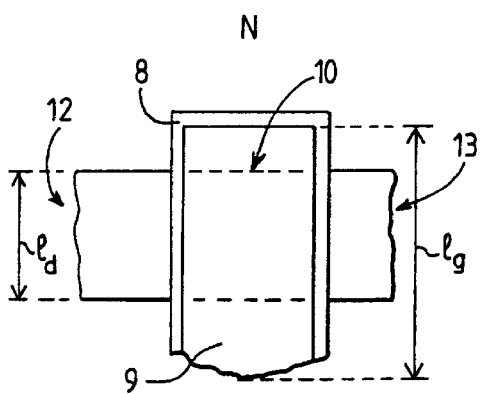
Figure 5B:
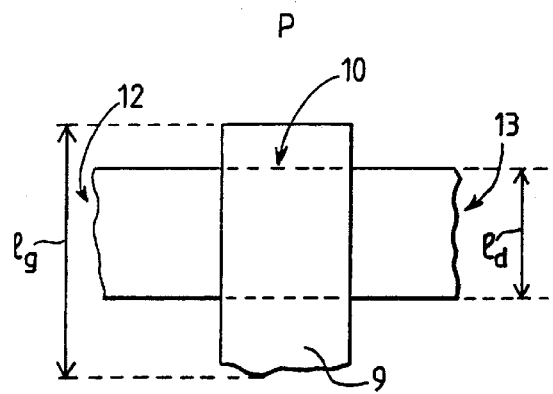

FIGS. 5a and 5b respectively show a top view of the N type transistor of FIG. 3d and the P type transistor of FIG. 4e respectively.

FIGS. 5a and 5b show a truncated view of the N type transistor and the P type transistor. FIGS. 5a and 5b give a schematic view of the relative arrangement of the gate and channel of the transistor.

The N type transistor in FIG. 5a has an insulator step 8. FIGS. 5a et 5b cover a part of the channel 10 of the transistor. The channel 10 is in the prolongation of the source 12, not shown, and of the drain 13, not shown.

The gate 9 has a width $I_g$. The channel has a width $I_d$. The etching of the gate 9 is done in such a way that $I_g > I_d$, according to the techniques of those skilled in the art.

The operation of doping the sources and drains of the N type transistors has been described with reference to FIG. 3d. Another embodiment of the doping operation can be implemented. It consists in:

performing a first operation of surface doping with the specified dopant, eliminating the insulator step on the edge of the conductive layer, performing a second surface doping operation with the specified dopant.

The making of the transistors, both N type and P type transistors, is complemented by an operation of passivation and an operation of opening contacts. These operations are performed according to known techniques. They require a fourth mask and a fifth mask.

In a second mode of implementation of the method according to the invention, the transistors of the first type are P type transistors and the transistors of the second type are N type transistors.

In a third mode of implementation of the method according to the invention, the method does not comprise the particular operation which consists in implanting an LDD region. The structures obtained are structures of the type known as offset structures.

In a fourth mode of implementation of the method according to the invention, the transistors of the second type are made on a substrate different from the substrate on which the transistors of the first type are made.

An addressing and control device for an active matrix liquid crystal display according to the invention is made with CMOS transistors obtained by a method according to the invention. The addressing and control device comprises an addressing device and a control device.

The addressing device is a device using CMOS complementary transistors. In a first embodiment, the N type and P type transistors are obtained according to the third mode of implementation of the method. The other embodiments of the addressing device are made by means of the other modes of implementation of the method for making transistors according to the invention.

The control device is a device that requires transistors having a low leakage current. It is made with transistors provided with an LDD region, preferably of the N type. The N type transistors are made according to the first mode of implementation of the method. Since the control device does not necessitate any complementary transistors, the first mode of implementation of the method may be limited solely to the making of N type transistors. The P type transistors are made according to the second mode of implementation of the method. Since the control device does not necessitate any complementary transistors, the first mode of implementation of the method may be limited solely to the making of P type transistors.

The invention has been described with reference, for example, to a glass substrate. The invention can be applied to other types of substrate such as plastic or quartz substrates.

The method according to the invention takes place at a given temperature included in a certain range. A glass substrate has a determined range of temperature corresponding to it. A plastic substrate has another range of temperature, lower than the determined range of temperature, corresponding to it. A quartz substrate has yet another range of temperature, higher than the determined temperature, corresponding to it.

What is claimed is:

1. Method of making transistors of a first type and a second type by CMOS technology in an active layer, characterized in that it comprises:

etching regions of the active layers or making them inactive to define active islands designed to form sources, channels of determined width and drains of the transistors of the first type and second type, covering the active islands with an insulating layer, covering the insulating layer with a conductive layer, covering the conductive layer with a resin protective layer, and sequentially etching the insulating layer, the conductive layer, and the resin protective layer to form all gates of the transistors of the first type and then all gates of the transistors of the second type.

2. Method for making transistors according to claim 1, characterized in that the etching all the gates of the transistors of the first type comprising:

defining a mask reproducing the gates of the transistors of the first type and masking the transistors of the second type, etching the gates of the transistors of the first type with the mask, removing the mask and in that the method comprises:

carrying out a doping operation with a determined dopant.

3. Method for making transistors according to claim 2, characterized in that the etching of the gates of the transistors of the first type comprises in isotropically over-etching the conductive layer until the insulator layer is reached and until a determined over-etching depth is opened, and is followed by an anisotropic etching of the insulator layer until an active island is reached, the isotropic over-etching and anisotropic etching operations being used to obtain, on the edge of the conductive layer, an insulator step whose width is given by the over-etching depth.

4. Method for making transistors according to claim 2, characterized in that the doping operation comprises:

an operation of low-energy doping and an operation of high-energy doping.

5. Method for making transistors according to claim 2, characterized in that the doping operation comprises:

carrying out a first doping operation with the determined dopant, eliminating the step on the edge of the conductive layer, carrying out a second doping operation with the determined dopant.

6. Method for making transistors according to claim 1, characterized in that the etching of all the gates of the transistors of the second type comprises:

defining a mask reproducing the gates of the transistors of the second type and masking the transistors of the first type, etching the gates of the transistors of the second type with the mask and in that the method consists in:

carrying out, with the mask, an operating of doping with a determined dopant.

7. Method for making transistors according to claim 1, characterized in that the transistors of the first type are N type transistors and the transistors of the second type are P type transistors.

8. Method for making transistors according to claim 7, characterized in that the dopant is phosphorus.

9. Method for making transistors according to claim 1 characterized in that the transistors of the first type are P type transistors and the transistors of the second type are N type transistors.

10. Method for making transistors according to claim 9, characterized in that the dopant is boron.

11. Method of making transistors according to claim 1, wherein sequentially etching comprises sequentially etching the resin protective layer to form all gates of the transistors of the first type using a first mask and then all gates of the transistors of the second type using a second mask.

12. Method for making transistors of a first type and a second type by CMOS technology in an active layer, characterized in that it comprises:

etching regions of the active layers or making them inactive to define active islands designed to form sources, channels of determined width and drains of the transistors of the first type and second type, covering the active islands with an insulating layer and covering the insulating layer with a conductive layer, sequentially etching all gates of the transistors of the first type and then all gates of the transistors of the second type, wherein the gate of each transistor has a width greater than a determined width of the channel between the drain and the source of the corresponding transistor.

13. Method for making transistors according to claim 12, wherein sequentially etching comprises sequentially etching a resin protective layer to form all gates of the transistors of the first type using a first mask and then all gates of the transistors of the second type using a second mask.

* * * * *